(12) United States Patent
McWilliam et al.

(10) Patent No.: US 6,883,113 B2
(45) Date of Patent: Apr. 19, 2005

(54) SYSTEM AND METHOD FOR TEMPORALLY ISOLATING ENVIRONMENTALLY SENSITIVE INTEGRATED CIRCUIT FAULTS

(75) Inventors: Bruce McWilliam, Manassas, VA (US); Ronald Todd, Amissville, VA (US); Thomas M. Storey, Manassas, VA (US)

(73) Assignee: Bae Systems Information and Electronic Systems Integration, Inc., Manassas, VA (US)

( * ) Notice: Subject to any disclaimer, the term of this patent is extended or adjusted under 35 U.S.C. 154(b) by 527 days.

(21) Appl. No.: 10/125,900

(22) Filed: Apr. 18, 2002

(65) Prior Publication Data

US 2003/0200484 A1 Oct. 23, 2003

(51) Int. Cl.[7] ............................................. G06F 11/00
(52) U.S. Cl. .......................... 714/17; 714/29; 714/30; 714/35; 714/37; 324/763; 324/764; 324/765
(58) Field of Search .............................. 714/17, 29, 30, 714/35, 37; 324/763–765

(56) References Cited

U.S. PATENT DOCUMENTS

| | | | |
|---|---|---|---|
| 4,553,225 A | | 11/1985 | Ohe |
| 4,680,762 A | | 7/1987 | Hardee et al. |
| 4,703,481 A | * | 10/1987 | Fremont ...................... 714/17 |
| 4,835,728 A | * | 5/1989 | Si et al. ...................... 713/401 |
| 5,123,017 A | | 6/1992 | Simpkins et al. |
| 5,291,495 A | * | 3/1994 | Udell, Jr. .................... 714/726 |
| 5,600,576 A | | 2/1997 | Broadwater et al. |
| 5,847,972 A | * | 12/1998 | Eick et al. ................... 709/246 |
| 5,872,449 A | | 2/1999 | Gouravaram et al. |
| 5,937,366 A | | 8/1999 | Zbytniewski et al. |
| 5,991,888 A | * | 11/1999 | Faulkner et al. ............ 713/501 |
| 6,057,679 A | | 5/2000 | Slizynski et al. |
| 6,073,089 A | | 6/2000 | Baker et al. |
| 6,078,189 A | | 6/2000 | Noel |
| 6,085,334 A | | 7/2000 | Giles et al. |
| 6,128,752 A | * | 10/2000 | Griess et al. ................. 714/17 |

OTHER PUBLICATIONS

Asad A. Ismaeel, et al., "Test for Detection & Location of Intermittent Faults in Combinational Circuits", IEEE Transactions On Reliability, vol. 46, No. 2, Jun., 1997, pp. 269–274.

K.P. Lentz, et al., "A Multiple Domain Environment for Efficient Simulation", Simulation Symposium, 1997. Proceedings., 30th Annual, IEEE, 1997, pp. 76–85.

* cited by examiner

*Primary Examiner*—Robert Beausoliel
*Assistant Examiner*—Emerson Puente
(74) *Attorney, Agent, or Firm*—Daniel J. Long; Graybeal Jackson Haley LLP

(57) ABSTRACT

A procedure for temporally isolating an environmentally dependent integrated circuit fault includes the steps of determining a marginally failing and a minimally passing environmental condition corresponding to the fault; identifying a clock cycle $T_{max}$ at which the fault was first detected; determining a candidate clock cycle at which the fault may have occurred; and iteratively a) applying test pattern subsets from an initial clock cycle through the candidate clock cycle under the marginally failing environmental condition; b) applying remaining test patterns under the minimally passing environmental condition; and c) adjusting the candidate clock cycle based upon whether the fault occurred during test pattern subset application up through the candidate clock cycle under the marginally failing environmental condition. Candidate clock cycle adjustment in accordance with a binary search technique enables determination of an exact clock cycle at which the fault occurred in a maximum of $Log_2$ ($T_{max}$+1) iterations.

20 Claims, 2 Drawing Sheets

SYSTEM AND METHOD FOR TEMPORALLY ISOLATING ENVIRONMENTALLY SENSITIVE INTEGRATED CIRCUIT FAULTS

BACKGROUND OF THE INVENTION

1. Field of the Invention

The present invention relates to systems and methods for testing integrated circuits. More particularly, the present invention is a system and method for determining an internal clock cycle at which a fault dependent upon operating conditions initially occurred.

2. Description of the Background Art

Integrated circuits are designed to properly function within particular ranges of operating or environmental conditions. Such conditions may include temperature; power supply voltage; input signal voltage levels; output signal loading; and/or other conditions. Integrated circuit manufacturers attempt to provide circuits that properly function within specified operating condition ranges, as well as outside such ranges.

Due to design and/or manufacturing flaws, one or more components within an integrated circuit may fail to exhibit acceptable functionality within a required operating condition range. As a result, an integrated circuit is subjected to tests during and/or after manufacture to determine whether it exhibits acceptable functionality. Such tests typically involve the application of test patterns to the integrated circuit at environmental extremes, and verifying whether the integrated circuit generates correct output responses.

Modern integrated circuits commonly include on the order of ten million transistors, essentially all of which must perform adequately over required ranges of operating conditions. Future integrated circuits are likely to include even greater numbers of transistors. Establishing which transistors within an integrated circuit are responsible for producing an observed failure can be very difficult.

Once an incorrect logic state exists within an integrated circuit, the incorrect logic state may not become observable at the integrated circuit's outputs for hundreds or even thousands of clock cycles. Furthermore, once conditions that activate an original fault or incorrect logic state are met, additional faults may occur prior to observation of the original fault. The additional faults may widen the divergence between correct and malfunctioning behavior, and/or obscure or cancel the effect of the original fault for a given amount of time in response to the application of certain test patterns.

What is needed is a system and method for reliably determining an exact clock cycle at which an incorrect internal logic state was first created, and minimizing any divergence between acceptable and faulty operation following creation of such a logic state.

SUMMARY OF THE INVENTION

The present invention comprises a system and method for temporally isolating integrated circuit faults that are dependent upon environmental or operating conditions. A system according to an embodiment of the invention may comprise a Device Under Test (DUT) interface unit, a test execution unit, and a control computer that together comprise an integrated circuit test platform. In one embodiment, the DUT interface unit and the test execution unit may comprise conventional hardware and/or software elements, such as a test head, a test fixture, one or more programmable power supplies, a set of Source and Measurement Units (SMUs), a switching matrix, and the like. The control computer may include a test management unit that directs the operation of the DUT interface unit and the test execution unit to facilitate the application of test patterns to integrated circuits under or across particular environmental operating conditions. The test management unit may include a fault isolation module that performs one or more procedures to temporally isolate integrated circuit faults in accordance with an embodiment of the invention.

In one embodiment, a procedure for temporally isolating environmentally dependent integrated circuit faults comprises the steps of applying a set of test patterns to an integrated circuit; selecting a fault that occurred during test pattern application; determining a minimally passing environmental condition P and a marginally failing environmental condition F associated with the fault; and determining a clock cycle $T_{max}$ at which the fault was first detected or recorded. Due to latency, the fault may have actually occurred at any time between a first clock cycle and $T_{max}$. The procedure may further apply test patterns under environmental condition F beginning with a first clock cycle through a candidate clock cycle $T_C$ that is less than $T_{max}$, followed by application of remaining test patterns under environmental condition P. Based upon whether the integrated circuit passed the test patterns applied under environmental condition F between the first clock cycle and the candidate clock cycle $T_C$ (that is, whether fault appeared or was recorded between the first clock cycle and the candidate clock cycle $T_C$), the procedure adjusts the candidate clock cycle $T_C$ to a later or an earlier clock cycle. In particular, if the integrated circuit failed, the fault occurred earlier than $T_C$, and the procedure adjusts $T_C$ to an earlier clock cycle. If the integrated circuit passed, the fault occurred after $T_C$, and the procedure adjusts $T_C$ to a later clock cycle. After adjusting $T_C$, the procedure repeats test pattern application under environmental conditions F and P as separated or split by clock cycle $T_C$, and adjusts $T_C$ based upon whether the integrated circuit passed the application of test patterns under environmental condition F in the manner previously described. Once $T_C$ cannot be further adjusted to an earlier or later untested clock cycle, the actual clock cycle at which the fault occurred may be known.

In one embodiment, the procedure adjusts the value of $T_C$ to an earlier or a later clock cycle in accordance with a binary search technique.

DETAILED DESCRIPTION

The following discussion is presented to enable a person skilled in the art to make and use the invention. The general principles described herein may be applied to embodiments and applications other than those detailed below without departing from the spirit and scope of the present invention as defined by the appended claims. The present invention is not intended to be limited to the embodiments shown, but is to be accorded the widest scope consistent with the principles and features disclosed herein.

The present invention comprises a system and method for temporally isolating faults within integrated circuits, where such faults may be sensitive to or dependent upon operating conditions and/or environmental parameters. The present invention may be applicable to essentially any type of front-end or back-end integrated circuit parametric testing environment. A system constructed and/or operating in accordance with an embodiment of the invention may comprise or be based upon essentially any type of system or platform for testing integrated circuits.

Figure 1:
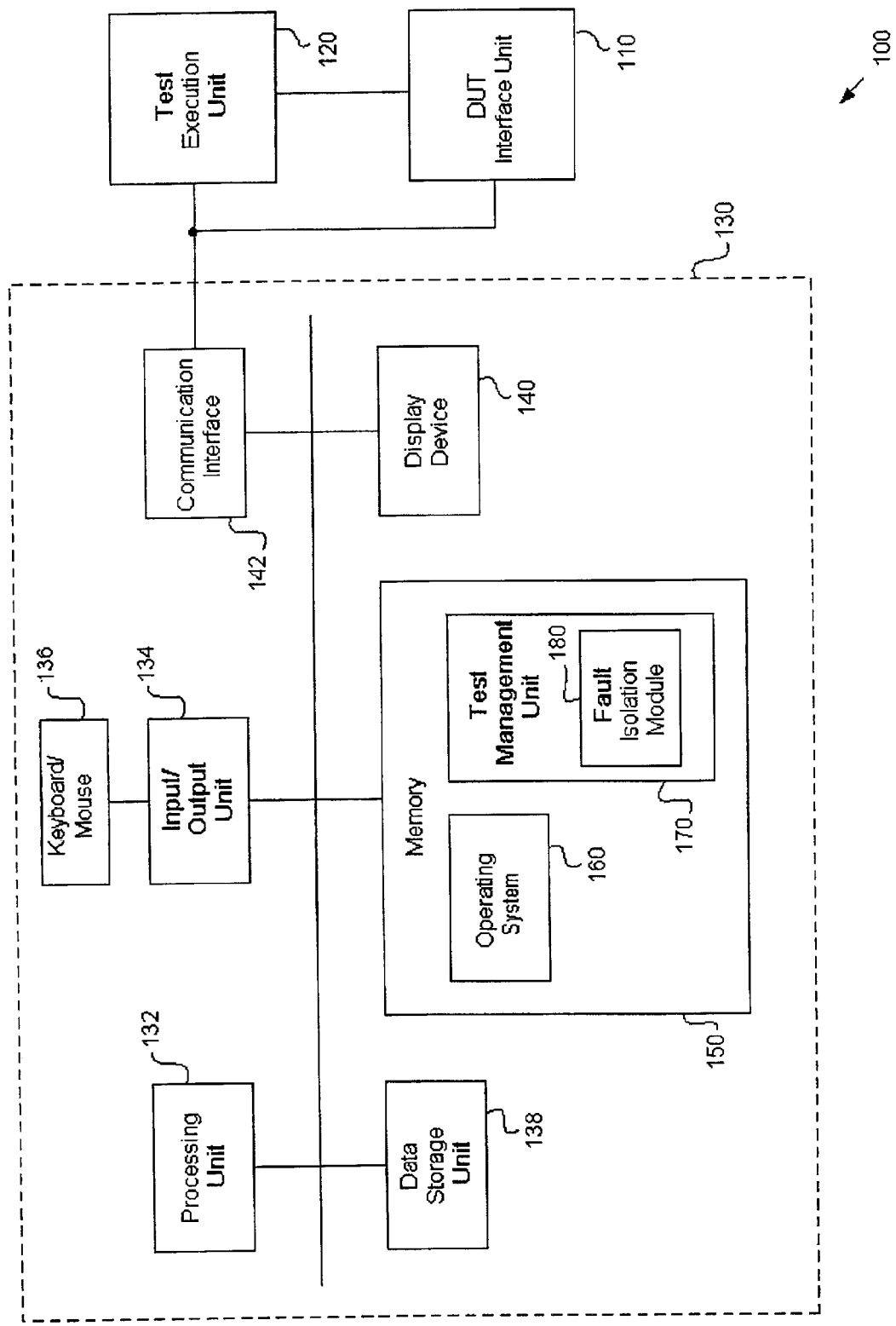
FIG. 1 is a block diagram of a system for temporally isolating environmentally sensitive integrated circuit faults constructed in accordance with an embodiment of the invention.

FIG. 1 is a block diagram of an IC test system or platform 100 for temporally isolating environmentally sensitive integrated circuit faults according to an embodiment of the invention. In one embodiment, the IC test system 100 comprises a Device Under Test (DUT) interface unit 110, a test execution unit 120, and a control computer 130. The DUT interface unit 110 is electrically coupled to the test execution unit 120, which is electrically coupled to the control computer 130. The DUT interface unit 110 may further be coupled to the control computer 130.

The DUT interface unit 110 may be conventional, and may comprise essentially any type of apparatus and/or mechanism for interfacing one or more integrated circuits to the text execution unit 120. The DUT interface unit 110 may comprise, for example, a test head and any associated test fixture for exchanging test signals and/or test results with the test execution unit 120; a DUT positioning apparatus or device; and integrated circuit handling and/or transport equipment, in a manner understood by those skilled in the art. Those skilled in the art will also understand that the handling and/or positioning elements may control environmental factors such as temperature and/or humidity. Those skilled in the art will further understand that the DUT interface unit 110 may be designed for a wafer probing environment or a packaged chip testing environment.

The test execution unit 120 may be conventional, and in one embodiment comprises a set of signal assertion, detection, and/or measurement devices, which may include, for example, one or more programmable power supplies and/or a set of Source and Measurement Units (SMUs). The test execution unit 120 may also comprise a switching matrix or signal routing mechanism that facilitates the establishment of selective connections or couplings between elements within the test execution unit 120 and the DUT. One or more elements within the test execution unit 120 may include a memory for storing program instruction sequences and/or data to facilitate test pattern application or integrated circuit testing procedures.

The control computer 130 may direct or manage the operation of the test execution unit 120 and/or the DUT interface unit 110 in accordance with the present invention. In one embodiment, the control computer 130 comprises one or more of the following: a processing unit 132; an input/output unit 134 and an associated input/output device 136 such as a keyboard and/or a mouse; a data storage unit 138; a display device 140; a communication interface 142; and a memory 150. Each element of the control computer may be coupled to a common bus 190.

The processing unit 132 may comprise a microprocessor for executing stored program instructions. The data storage unit 138 may comprise one or more hard disk drives, and the display device 140 may comprise a Cathode Ray Tube (CRT) or flat panel monitor. The communication interface 142 may comprise one or more of a serial, a parallel, a Universal Serial Bus (USB), an IEEE 488, an IEEE 1394, an Ethernet, or other interface and associated hardware and software that facilitate signal exchange in accordance with a known protocol. The communication interface 142 may be coupled to the test execution unit 120 and/or the DUT interface unit 110. Finally, the memory 150 may comprise Random Access Memory (RAM), Read Only Memory (ROM), and/or other types of storage elements in which program instructions and/or data may reside.

In one embodiment, an operating system 160 and a test management unit 170 reside within the memory 150. The operating system 160 may comprise program instructions that manage access to system resources, in a manner understood by those skilled in the art. The test management unit 170 may comprise program instructions that direct or oversee the operation of the test execution unit 120 and/or the DUT interface unit 110. Thus, the test management unit 170 may direct the application of test vectors or test patterns to one or more integrated circuits to verify integrated circuit operating characteristics across a range of conditions. In one embodiment, the test management unit 170 and/or the test execution unit 120 may include program instruction routines for performing particular types of tests upon known classes of integrated circuits.

The test management unit 170 may include a fault isolation module 180, which comprises program instructions that direct or oversee the temporal isolation of environmentally sensitive integrated circuit faults in accordance with the present invention. In one embodiment, the fault isolation module 180 operates in conjunction with the test management unit 170, the test execution unit 120, and/or the DUT interface unit 110 to effectuate temporal isolation of environmentally sensitive integrated circuit faults in manners described in detail hereafter.

Figure 2:
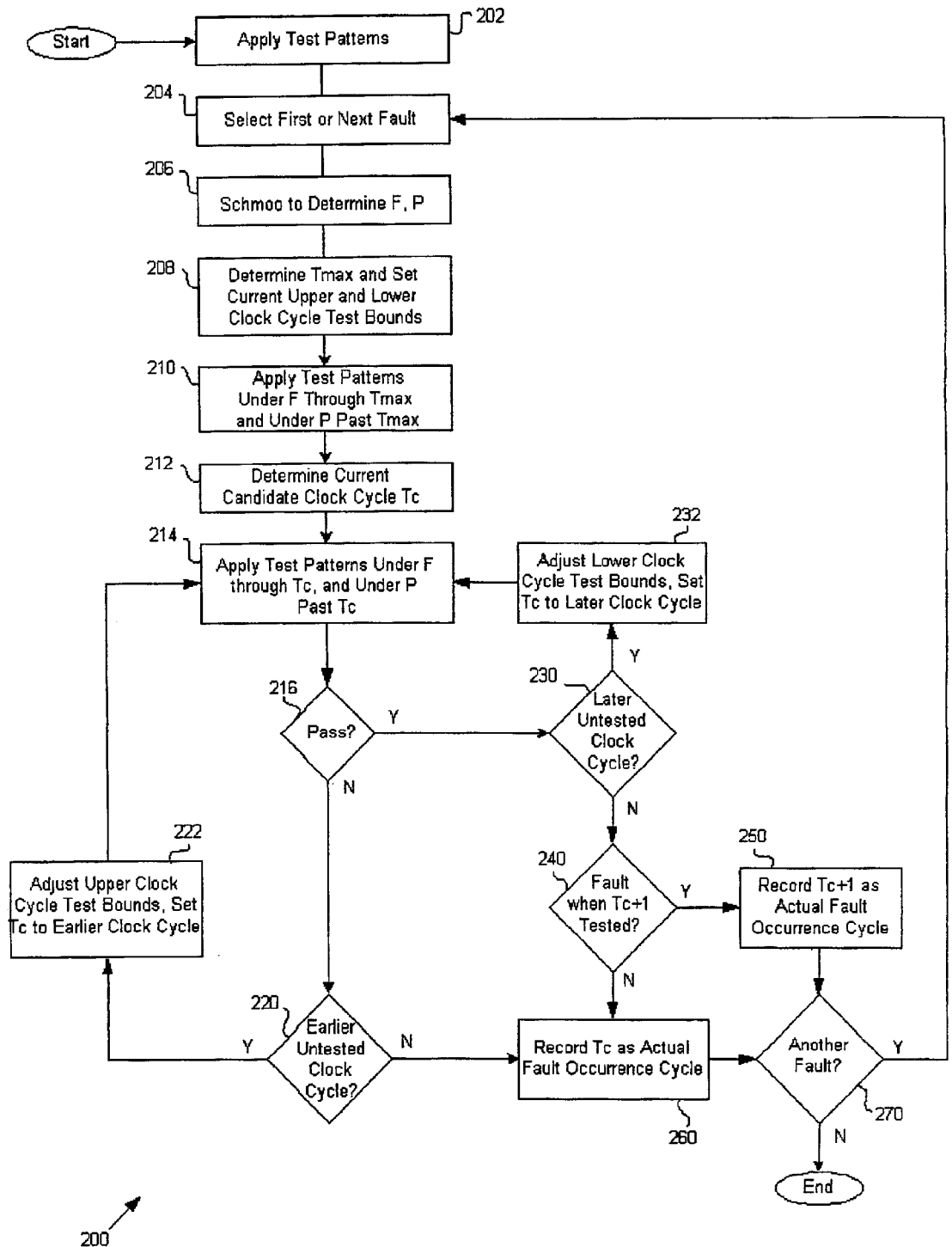
FIG. 2 is a flowchart of a process for temporally isolating environmentally sensitive integrated circuit faults in accordance with an embodiment of the invention.

FIG. 2 is a flowchart of a procedure 200 for temporally isolating environmentally sensitive integrated circuit faults according to an embodiment of the invention. The procedure 200 begins in step 202 by applying a set of test patterns to an integrated circuit across an entire range of required or desired operating conditions. During step 202, the procedure 200 records test results, which may include integrated circuit operating faults or failures and corresponding environmental or operating conditions.

Following step 202, the procedure 200 selects or identifies a first fault within an operating range in step 204. Next, in step 206, the procedure 200 performs one or more schmoo operations by continually incrementing a set of applied conditions (e.g., power supply voltage or other environmental or operating conditions) associated with the selected fault until a minimum separation between the integrated circuit passing the entire test pattern set and triggering the selected fault occurs. Those skilled in the art will understand that schmooing is a standard capability provided by modern-day integrated circuit test equipment. During step 206, the procedure 200 may identify or determine an environmental condition at which the integrated circuit minimally passes the entire test pattern as "P," and an environmental condition at which the integrated circuit marginally fails as "F."

As an illustrative example, a test pattern set may pass when the power supply voltage is 5.0 Volts, but fail when the power supply voltage is 4.5 Volts. During a schmoo operation, the power supply voltage may be varied in 0.1 Volt increments to determine that the integrated circuit passes the test patterns at 4.8 Volts, but fails at 4.7 Volts. Thus, the environmental condition P at which the integrated circuit minimally passes the test patterns may be 4.8 Volts, while the environmental condition F at which the integrated circuit marginally fails the test patterns may be 4.7 Volts.

The procedure 200 may subsequently identify a clock cycle $T_{max}$ at which the test pattern failure or fault was first detected in step 208. Due to latency, it is unlikely that the fault or failure was actually activated or triggered at clock cycle $T_{max}$, and thus $T_{max}$ may serve as an upper temporal bound relative to the fault's occurrence. The fault may have actually occurred at any given clock cycle from a first clock cycle up through $T_{max}$. In step 208, the procedure 200 may also set an initial value of a current upper clock cycle test bound $T_U$ to the value of $T_{max}$; and an initial value of a current lower clock cycle test bound $T_L$ to the value of a first occurring clock cycle, which may be defined as zero. Those skilled in the art will understand that in an alternate embodiment, $T_L$ may be initially assigned a value of one.

In step 210, the procedure 200 applies test patterns under environmental condition F up to and including clock cycle $T_{max}$, and then applies the remaining test patterns under environmental condition P. That is, a subset of the test patterns are applied from a first clock cycle through clock cycle $T_{max}$ under environmental condition F, after which remaining test patterns are applied under environmental condition P. At this stage, the exact clock cycle at which the selected fault was activated or triggered is somewhere or sometime between the beginning of test pattern application and clock cycle $T_{max}$. In the event that the environmental or operating condition under consideration is the power supply voltage, the procedure 200 may ensure that the transition from condition F to condition P occurs without powering down the integrated circuit to ensure that internal circuit states are preserved.

The procedure 200 subsequently determines a current candidate clock cycle $T_C$ that is a portion of $T_{max}$ (i.e., a number of clock cycles less than $T_{max}$) in step 212. The current candidate clock cycle $T_C$ may initially be defined as a predetermined fraction of the upper bound clock cycle $T_{max}$. In one embodiment, the current candidate clock cycle is initially defined as one-half of clock cycle $T_{max}$, that is, $0.5*T_{max}$. In step 214, the procedure 200 applies test patterns under operating condition F up through the current candidate clock cycle $T_C$, after which the procedure 200 applies the remaining test patterns under operating condition P. That is, a subset of test patterns is applied under operating condition F through the current candidate clock cycle $T_C$, after which the remaining test patterns are applied under operating condition P. The procedure 200 subsequently determines in step 216 whether the selected fault occurred during test pattern application, that is, whether the integrated circuit passed the test patterns applied under conditions F and P.

If the selected fault occurred, then the selected fault was first activated somewhere between clock cycle 0 and the current candidate clock cycle $T_C$. If the selected fault did not occur, that is, if the integrated circuit passed the test patterns applied under environmental condition F up through the current clock cycle subinterval (and subsequently passed the remaining test patterns applied under environmental condition P), then the selected fault was first activated after the current candidate clock cycle $T_C$.

If the selected fault occurred, the procedure 200 determines whether a clock cycle that occurs before, prior to, or earlier than the current candidate clock cycle $T_C$ remains to be tested in step 220. If not, the current candidate clock cycle $T_C$ is the exact clock cycle at which the selected fault was activated, and the procedure 200 proceeds to step 260 to record and/or indicate the exact failure activation clock cycle. Otherwise, the procedure 200 sets the value of $T_U$, the current upper clock cycle test bound, to that of the current candidate clock cycle $T_C$; and subsequently decreases or decreases the value of $T_C$ to an earlier occurring untested clock cycle in step 222.

The procedure 200 may decrement or reduce the value of the current candidate clock cycle $T_C$ in accordance with a predetermined function, and/or a predetermined factor or fraction of its value. In one embodiment, the value of $T_C$ is adjusted in step 222 as $T_C=0.5*(T_U+T_L)$. In such an embodiment, if $T_U$ equals $T_{max}$, $T_L$ equals 0, and $T_C$ equals $0.5*T_{max}$, $T_U$ may be it may adjusted or set to $0.5*T_{max}$, and $T_C$ may be adjusted to $0.5*(0.5*T_{max}+0)$, or $0.25*T_{max}$, in step 222. Those skilled in the art will understand that if necessary, the value of $T_C$ may be appropriately rounded or truncated to an integral value. Following step 222, the procedure 200 returns to step 214.

If in step 216 the procedure 200 determines that the selected fault did not occur (i.e., the integrated circuit passed the test patterns applied across both of operating conditions F and P, in accordance with a transition from operating condition F to operating condition P after the current candidate clock cycle), the procedure 200 determines whether a clock cycle that occurs after or later than the current candidate clock cycle $T_C$ remains to be tested in step 230. If not, the procedure 200 determines in step 240 whether the integrated circuit had already been tested in accordance with step 214 under a current candidate clock cycle having a value of one clock cycle beyond its present value, and whether the selected fault had occurred under such conditions. If so, the procedure 200 records and/or indicates the exact fault activation clock cycle as $T_C+1$ in step 250; otherwise, the procedure records and/or indicates the exact clock cycle at which the selected fault or failure was activated as $T_C$ in step 260.

If the procedure 200 determines in step 230 that a clock cycle occurring after or later than the current candidate clock cycle $T_C$ remains to be tested, the procedure 200 sets the value of $T_L$, the current lower clock cycle test bound, to that of the current candidate clock cycle $T_C$; and subsequently increments or increases the value of $T_C$ to a later clock cycle in step 232. The procedure 200 may increment or increase the value of the current candidate clock cycle $T_C$ in accordance with a predetermined formula and/or fraction or factor of its value. The value of the current candidate clock cycle may be increased as $T_C=0.5*(T_U+T_L)$ in a manner identical, essentially identical, or analogous to that described above. Thus, if $T_U$ equals $T_{max}$ and $T_L$ has been adjusted to $0.5*T_{max}$, $T_C$ may be assigned a new value equal to $0.5*(T_{max}+0.5*Tm_{ax})$, or $0.75*T_{max}$. The value of $T_C$ may be appropriately rounded or truncated to an integral value, in a manner readily understood by those skilled in the art. Following step 250, the procedure 200 returns to step 214.

After either of steps 250 or 260, the procedure 200 determines in step 270 whether another fault requires consideration. If so, the procedure 200 returns to step 204 to select a next fault; otherwise, the procedure 200 ends.

In one embodiment, the selective adjustment of a current candidate clock cycle $T_C$ in accordance with a factor of 0.5 relative to a current upper clock cycle test bound and a current lower clock cycle test bound establishes a binary search within a range of possible fault occurrence clock cycles. This binary search provides an efficient technique for rapidly isolating or determining an exact clock cycle at which an integrated circuit fault actually occurred. The use of a binary search to determine an exact clock cycle at which an integrated circuit fault actually occurred requires no more than $Log_2(T_{max}+1)$ iterations. Other embodiments of the present invention may decrement, increment, and/or adjust a current candidate clock cycle value, a current clock cycle upper test bound, and/or a current clock cycle lower test bound in one or more other manners. Once an exact fault occurrence time or clock cycle is determined, analysis of integrated circuit behavior associated with the fault can advantageously indicate an exact or approximate integrated circuit region or subcircuit that is responsible for generating the fault.

What is claimed is:

1. A method for temporally isolating a fault within an integrated circuit comprising the steps of:

determining a marginally failing environmental condition associated with the fault;

determining a clock cycle at which the fault was first detected; and applying a plurality of first test pattern subsets under the marginally failing environmental condition, wherein each first test pattern subset is applied from an initial clock cycle through a unique candidate clock cycle.

2. The method of claim 1, wherein a first candidate clock cycle is temporally earlier than the clock cycle at which the fault was first detected.

3. The method of claim 1, wherein each candidate clock cycle is temporally earlier than the clock cycle at which the fault was first detected.

4. The method of claim 1, wherein each first test pattern subset comprises a unique number of test patterns.

5. The method of claim 1, wherein a candidate clock cycle has a value based upon whether the fault appeared during application of a most recent first test pattern subset under the marginally failing environmental condition.

6. The method of claim 1, further comprising the step of adjusting a candidate clock cycle to an earlier clock cycle in the event that the fault appeared during application of a most recent first test pattern subset under the marginally failing environmental condition.

7. The method of claim 1, further comprising the step of adjusting a candidate clock cycle to a later clock cycle in the event that the fault was absent during application of a most recent first test pattern subset under the marginally failing environmental condition.

8. The method of claim 1, further comprising the step of adjusting a candidate clock cycle in accordance with a binary search technique based upon whether the fault occurred during application of a most recent first test pattern subset under the marginally failing environmental condition.

9. The method of claim 1, further comprising the step of determining a minimally passing environmental condition associated with the fault.

10. The method of claim 9, wherein determination of the marginally failing environmental condition and determination of the minimally passing environmental condition is determined through a schmoo operation.

11. The method of claim 1, further comprising the steps of:

determining a minimally passing environmental condition associated with the fault; and applying a plurality of second test pattern subsets under the minimally passing environmental condition.

12. The method of claim 1, wherein the determination of the marginally failing environmental condition is performed through a schmoo operation.

13. A method for temporally isolating a fault within an integrated circuit comprising the steps of:

determining a marginally failing environmental condition associated with the fault;

identifying a clock cycle $T_{max}$ at which the fault was first detected;

determining a candidate clock cycle at which the fault may have occurred;

iteratively performing the substeps of:

applying test pattern subsets from an initial clock cycle through the candidate clock cycle under the marginally failing environmental condition; and adjusting the candidate clock cycle based upon whether the fault occurred during test pattern subset application; and determining an exact clock cycle at which the fault occurred in a maximum of $Log_2(T_{max}+1)$ substep iterations.

14. A method for temporally isolating a fault within an integrated circuit comprising the steps of:

determining a marginally failing environmental condition associated with the fault;

determining an upper bound clock cycle corresponding to a latest clock cycle at which the fault may have occurred;

determining a lower bound clock cycle corresponding to an earliest clock cycle at which the fault may have occurred;

determining a candidate clock cycle at which the fault may have occurred;

applying a test pattern subset from an initial clock cycle through the candidate clock cycle under the marginally failing environmental condition; and adjusting the candidate clock cycle and one from the group of the upper bound clock cycle and the lower bound clock cycle based upon whether the fault occurred during test pattern subset application.

15. The method of claim 14, wherein the adjusting step comprises the substeps of:

setting the upper bound clock cycle to the candidate clock cycle; and setting the candidate clock cycle to an earlier occurring clock cycle.

16. The method of claim 14, wherein the adjusting step comprises the substeps of:

setting the upper bound clock cycle to the candidate clock cycle; and setting the candidate clock cycle to an earlier occurring clock cycle in accordance with a binary search technique.

17. The method of claim 14, wherein the adjusting step comprises the substeps of:

setting the lower bound clock cycle to the candidate clock cycle; and setting the candidate clock cycle to a later occurring clock cycle.

18. The method of claim 14, wherein the adjusting step comprises the substeps of:

setting the lower bound clock cycle to the candidate clock cycle; and setting the candidate clock cycle to a later occurring clock cycle in accordance with a binary search technique.

19. The method of claim 14, further comprising the step of performing the applying and adjusting steps a plurality of times.

20. The method of claim 14, further comprising the step of performing the applying and adjusting steps until a most recent candidate clock cycle identifies an exact clock cycle at which the fault was first activated.

* * * * *